United States Patent
Yang et al.

(10) Patent No.: US 7,644,336 B2
(45) Date of Patent: Jan. 5, 2010

(54) TECHNIQUES FOR PROVIDING GREATER ERROR PROTECTION TO ERROR-PRONE BITS IN CODEWORDS GENERATED FROM IRREGULAR CODES

(75) Inventors: Sizhen Yang, Costa Mesa, CA (US); Yuan Xing Lee, San Jose, CA (US); Shaohua Yang, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 565 days.

(21) Appl. No.: 11/346,836

(22) Filed: Feb. 4, 2006

(65) Prior Publication Data

US 2007/0186138 A1     Aug. 9, 2007

(51) Int. Cl.
    *H03M 13/00*    (2006.01)
(52) U.S. Cl. .................. 714/755; 714/752; 375/298; 375/316
(58) Field of Classification Search ............ 714/755, 714/752, 784; 370/479; 375/298, 316
    See application file for complete search history.

(56) References Cited

U.S. PATENT DOCUMENTS

| | | | |
|---|---|---|---|
| 5,951,708 A * | 9/1999 | Yoshida | .......... 714/752 |
| 6,657,967 B1 | 12/2003 | Fujisawa et al. | |
| 7,343,539 B2 * | 3/2008 | Divsalar et al. | .......... 714/755 |
| 7,423,996 B2 * | 9/2008 | Son et al. | .......... 370/335 |
| 2003/0172338 A1 | 9/2003 | Miyata et al. | |
| 2006/0224935 A1 * | 10/2006 | Cameron et al. | .......... 714/752 |

OTHER PUBLICATIONS

Todd K. Moon, "An Introduction to Low-Density Parity-Check Codes," Electrical and Computer Engineering Department, Utah State University, pp. 1-31.

* cited by examiner

*Primary Examiner*—Guy J Lamarre
*Assistant Examiner*—Sam Rizk
(74) *Attorney, Agent, or Firm*—Steven J. Cahill

(57) ABSTRACT

Greater error protection is provided to error-prone bits that are generated from irregular soft-decoded error correction codes. Error protection is increased to error-prone bits that of interest in a particular system (e.g., parity check bits). One or more extra bits are added to each codeword in the encoding process. The one or more extra bits correspond to lower weights. The one or more extra bits are discarded after each codeword is decoded.

20 Claims, 3 Drawing Sheets

TECHNIQUES FOR PROVIDING GREATER ERROR PROTECTION TO ERROR-PRONE BITS IN CODEWORDS GENERATED FROM IRREGULAR CODES

BACKGROUND OF THE INVENTION

The present invention relates to error correction encoding and decoding, and more particularly, to techniques for providing greater error protection to error-prone bits generated from irregular error correction codes.

Error correcting codes are used in data recording systems to ensure data reliability and to reduce the adverse effects of channel noise. Parity codes are examples of error correction codes. Parity codes are often used to correct errors that occur in data transmitted over a communications channel or stored on a digital storage medium. For example, parity check codes are often used to correct errors in data stored on magnetic hard disks.

Error correction decoding can be performed using hard decision decoders or soft-decision decoders. Hard decision decoding is generally based on an assumption that all bits in a codeword are equally likely to be in error. Hard decision decoding generally does not consider that some bits are more reliable than others. However, hard decision decoding codes that provide un-equal protection do exist.

Soft-decision decoding receives input analog data (e.g., an equalized read-back signal or bit reliability information) and preferentially flips unreliable bits. In soft decision decoding, the log-likelihood ratio (LLR) is a measure of the likelihood of a bit being a '1' divided by the likelihood of the bit being '0.' A greater absolute value of LLR indicates a more reliable bit. A soft decision decoder uses the LLR for each bit to evaluate the probability that the bit is in error. Soft-decision decoding out-performs hard-decision decoding, because it is able to exploit the fact that some bits are more reliable than others.

A low density parity check (LDPC) code is a linear error-correcting code that has a parity check matrix H with a small number of nonzero elements in each row and column. LDPC codewords may be decoded using soft-decision decoding. LDPC codes can be defined over any finite field. For example, an LDPC codes can be defined over GF(2), in which "1" is the only nonzero element.

The weight (or degree) of an LDPC code refers to the number of elements that have a non-zero value among the elements constituting the parity check matrix. In a regular LDPC parity check matrix, all the rows have the same weight, and all the columns have the same weight. Thus, a regular LDPC code has the same number of non-zero elements in each column of its parity check matrix, and the same number of non-zero elements in each row of its parity check matrix. Some of the columns and/or some of the rows in a parity check matrix of an irregular LDPC code have different weights.

In a standard encoding process, a block of information bits is encoded using a generator matrix that can be derived from the parity check matrix of a LDPC code. In soft-decision decoding, the strength of error protection that is provided to each bit depends on the weight of the corresponding column in the parity check matrix that is used to decode codewords. Thus, regular LDPC codes provide the same level of error protection to each bit in the codeword, because each column in the parity check matrix has the same weight. An irregular LDPC code provides different levels of error protection to bits in the codeword, because some columns in the parity check matrix have different weights. Bits corresponding to the columns with a lower weight are provided less error protection.

Repeat-accumulate (RA) LDPC codes are another class of error correcting codes used in communications and data storage applications. RA LDPC codewords can also be decoded using soft-decision decoding. RA LDPC codes include regular RA codes, irregular RA codes, and extended irregular RA codes (eIRA codes). RA LDPC codes are weak in error protection (WEP) on the parity check bits in a codeword. RA LDPC codes provide stronger error protection to information bits than to parity check bits.

In soft-decision decoding, multiple decoding iterations are performed to cause each bit to converge to a more reliable value (i.e., a higher LLR). In each iteration of an irregular RA LDPC decoding process, the LLR for parity check bit nodes converge slower than the LLR for information bit nodes, and the LLR for parity check nodes converge to a smaller magnitude than the LLR for information bit nodes due to the irregular weight distribution.

Usually, parity check bits are thrown away after the completion of RA LDPC decoding. Only the information bits are of interest. Therefore, WEP does not cause the error rate performance of RA LDPC codes to degrade.

However, both information and parity check bits are of interest in certain applications. In these applications, the error rate performance of irregular RA LDPC codes degrades, because of the weak error protection provided to the parity check bits. Irregular RA LDPC codes provide better error protection to information bits than to parity check bits, leaving the parity check bits more vulnerable to channel noise.

The cause of this problem relates to the structure of RA LDPC codes. For example, information bits typically correspond to large column weights, and the parity check bits typically correspond to a column weight of 2. However, the last parity check bit corresponds to a single-weight column, and therefore, the last parity check bit is especially vulnerable to channel noise. The LLR of the last parity check bit is slow to converge and converges to a small magnitude. For these reasons, the last parity check bit that corresponds to a single-weight column is particularly prone to errors, and tends to cause a small number of adjacent parity check bits to have errors.

Therefore, it would be desirable to provide irregular error correcting codes that can provide greater error protection for parity check bits.

BRIEF SUMMARY OF THE INVENTION

The present invention provides greater error protection to error-prone bits that are generated from irregular soft-decoded error correction codes. Some bits (e.g., parity check bits) generated from irregular error correction codes have weaker error protection than other bits, because they correspond to a lower weight. According to the present invention, error-prone bits that are of interest to a particular system are given higher weights to increase the error protection provided to these bits. One or more extra bits are added to each codeword in the encoding process. The one or more extra bits correspond to lower weights and are discarded after each codeword is decoded.

Other objects, features, and advantages of the present invention will become apparent upon consideration of the

DETAILED DESCRIPTION OF THE INVENTION

Figure 1:
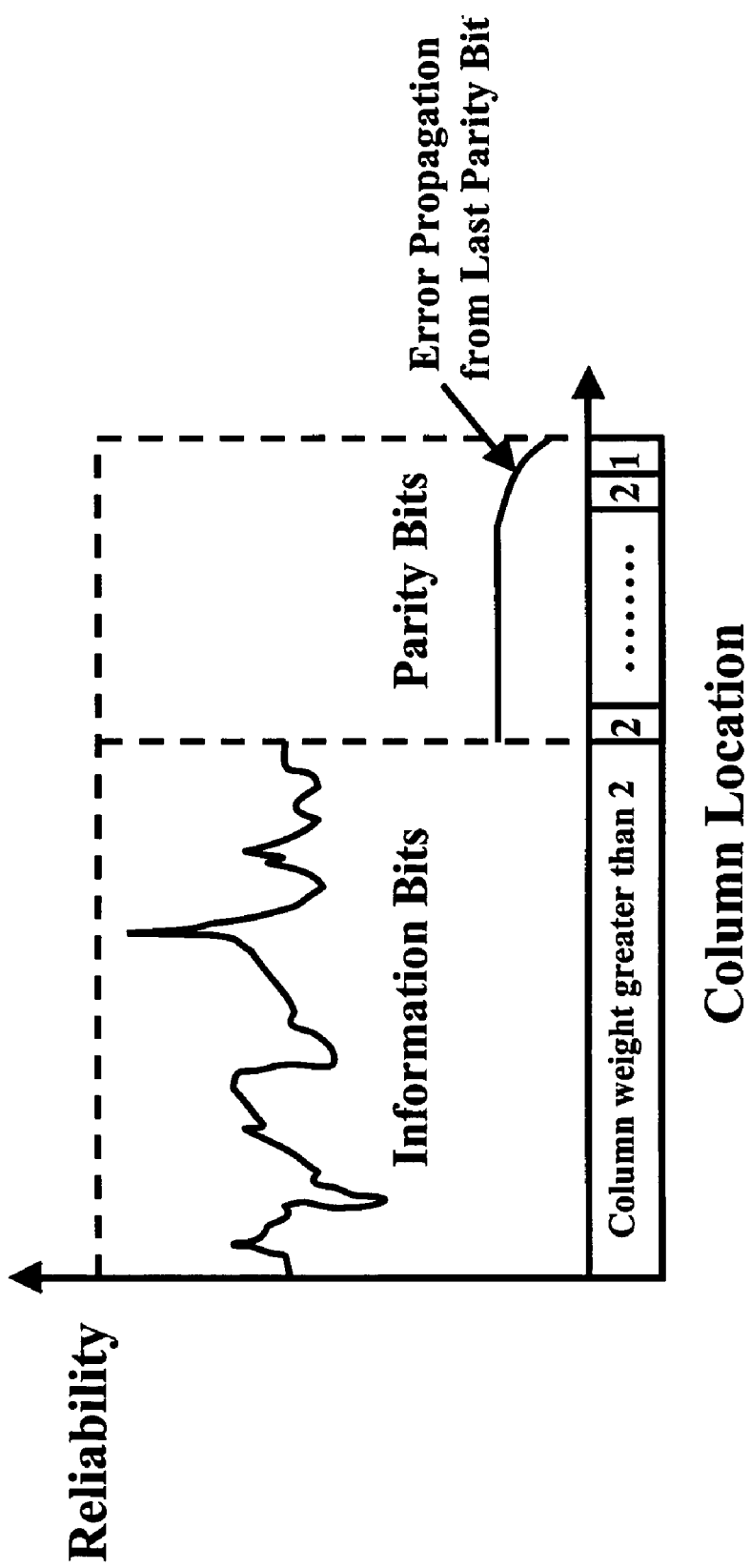
FIG. 1 is a graph that illustrates a varying degree of reliability that an irregular RA error correction code provides to parity check bits compared to information bits.

FIG. 1 is a graph that illustrates the disparity in the reliability between parity check bits and information bits generated by an irregular RA LDPC error correction code. An irregular LDPC code typically provides greater error protection to information bits than to parity check bits, because the information bits correspond to higher weights than the parity bits in the parity check matrix.

FIG. 1 illustrates a graph that is based on an exemplary irregular RA LDPC code having an exemplary parity check matrix. Each of the information bits corresponds to a column of the parity check matrix having a weight greater than 2. Most of the parity check bits correspond to a column of the parity check matrix having a weight equal to 2. However, the last parity check bit corresponds to a column weight of 1. Thus, the weight of the columns in the parity check matrix decrease in columns after the information bits.

An LDPC code can be decoded using a soft-decision decoding process. In each iteration of an irregular RA LDPC decoding process, the log likelihood ratios (LLR) for parity check bit nodes converge more slowly and to a smaller magnitude than the LLR for information bit nodes, because the parity check bits correspond to columns of the parity check matrix that have smaller weights. Thus, the parity check bits are less likely to be correct than the information bits for a given iteration. As the weight of the columns in the parity check matrix decrease, the reliability of the corresponding parity check bits also decrease as shown in FIG. 1.

Some types of RA LDPC codes are irregular error correction codes. An irregular RA LDPC parity check matrix can be represented by $H=[H_1, H_2]$ for an (n, k) LDPC code. $H_1$ is a sparse $(n-k) \times k$ matrix without degree-2 columns, and $H_2$ is a full-rank $(n-k) \times (n-k)$ matrix. An example of an $H_2$ parity check matrix for an irregular RA LDPC code is given by:

$$H_2 = \begin{bmatrix} 1 & & & & & \\ 1 & 1 & & & & \\ & 1 & 1 & & & \\ & & & \ddots & & \\ & & & & 1 & 1 \\ & & & & & 1 & 1 \end{bmatrix}$$

The last parity bit in the $H_2$ matrix corresponds to a degree-1 column, and therefore, the last parity bit has a low LLR. This $H_2$ matrix is shown merely for illustration purposes and is not intended to limit the scope of the present invention in any way.

Some applications that use irregular soft-decoded error correction codes require greater reliability for the parity check bits than can be provided by standard irregular RA LDPC codes. One example of such an application is described in commonly-assigned, co-pending U.S. patent application Ser. No. 11/198,945, filed Aug. 5, 2005, by Shaohua Yang et al., which is incorporated by reference herein. The present invention solves this problem by providing greater reliability and error protection to parity check bits that are generated from irregular soft-decoded error correction codes.

Figure 2:
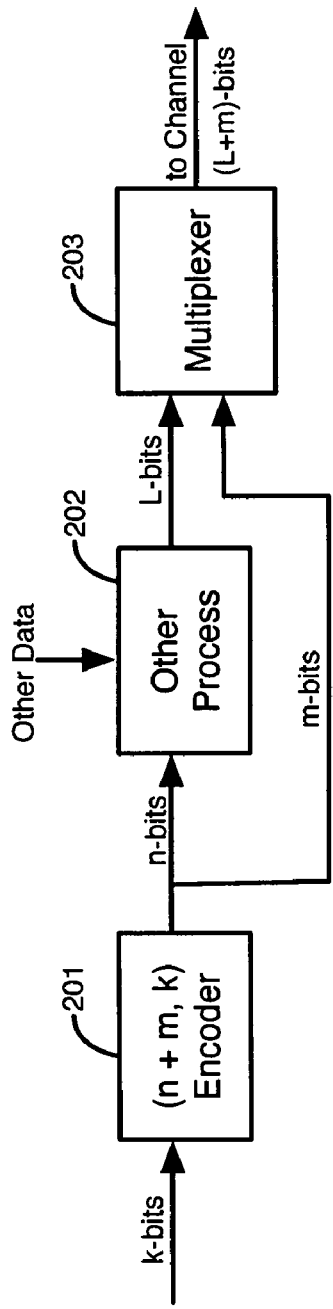
FIG. 2 illustrates an encoding system that adds at least one extra bit to each codeword using an irregular soft-decoded error correction code, according to an embodiment of the present invention.

FIG. 2 illustrates an encoding system that adds at least one extra bit to each codeword using an irregular soft-decoded error correction code, according to an embodiment of the present invention. The embodiment of the present invention shown in FIG. 2 includes an (n+m, k) encoder 201. Encoder 201 encodes sets of k-bits and generates a block of (n+m)-bits for each set of k-bits. Encoder 201 applies an irregular error correction code (ECC) that can be decoded using a soft-decision decoding process (e.g., an irregular LDPC code). The n-bits are then separated from the m-bits (e.g., using a demultiplexer). The n-bits are transmitted to other process 202, and the m-bits are transmitted to multiplexer 203. Other processes 202 require a block of n-bits for each set of k-bits that are provided to the system. The other processes 202 map each block of n-bits to a block of L-bits using at least one encoder. Multiplexer 203 combines the L-bits with the m-bits to generate (L+m)-bit words that are transmitted to a channel (e.g., for recording to a data storage medium).

Encoder 201 generates codewords that have an extra set of m-bits relative to the number of encoded n-bits required by the other processes 202. Other processes 202 represent an application that requires high reliability for all of the n-bits in each codeword. For example, other processes 202 may require high reliability for information bits and parity check bits.

Encoder 201 provides higher reliability to the n-bits in each codeword by generating (n+m)-bit codewords that have one or more extra m-bits. Low weight columns of the parity check matrix correspond to the extra m-bits. Thus, the m-bits of each codeword have the lowest reliability. The n-bits in each codeword have a higher reliability, including, for example, the parity check bits, because the n-bits correspond to higher weight columns of the parity check matrix than the m-bits. Encoder 201 can provide a substantially equal weight (or a variable weight) to the n-bits in each codeword. The m-bits are subsequently discarded after decoding, and therefore, they do not degrade the overall reliability of the error correction process.

Encoder 201 can add one or more extra m-bits to each codeword. Because each parity check equation applies to more than one bit, an unreliable bit can adversely effect the reliability of other bits in the codeword that are constrained by the same parity check equation. To address this potential problem, encoder 201 can add two or more extra m-bits to each (n+m)-bit codeword to further increase the reliability of the n-bits. These embodiments of the present invention preferably contain parity check equations that minimize the impact that the unreliable m-bits have on the reliability of adjacent n-bits.

Preferably, encoder 201 adds a small number of m-bits relative to the number of n-bits in each codeword so that they do not cause an adverse effect on the system's code rate. For example, encoder 201 can add 1, 2, 3, 4, or 5 m-bits to a codeword having hundreds or thousands of n-bits.

Figure 3:
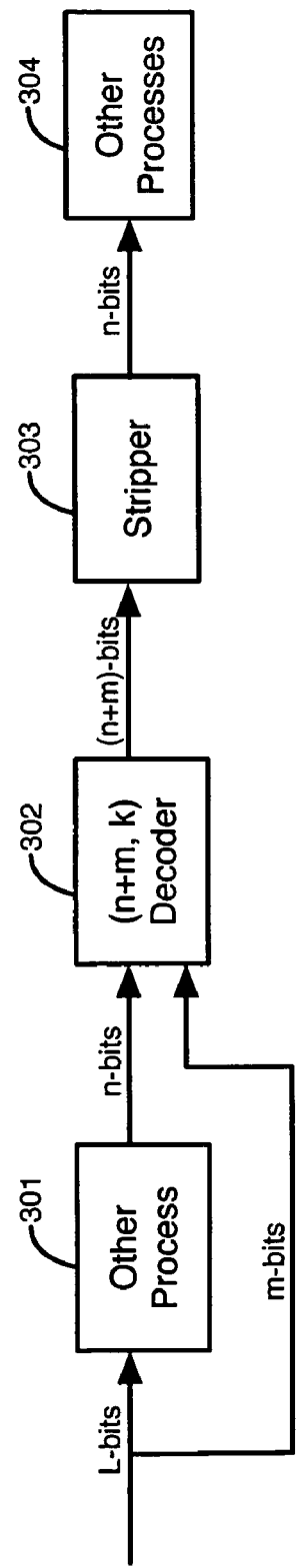
FIG. 3 illustrates a decoding system that decodes codewords having at least one extra bit and removes the one or more extra bits, according to another embodiment of the present invention.

FIG. 3 illustrates a soft-decision decoding system that decodes codewords having at least one extra m-bit and then removes the extra m-bits, according to an embodiment of the present invention. Initially, the m-bits are separated from the (L+m)-bit words (e.g., using a demultiplexer), because other processes 301 do not use the m-bits. Other processes 301 map the blocks of L-bits to blocks of n-bits using at least one decoder.

Subsequently, (n+m, k) decoder 302 decodes the n-bits and m-bits to correct any errors in the n-bits and m-bits using a soft-decision decoding process (e.g., an irregular LDPC code). Decoder 302 generates codewords that each have (n+m)-bits. Stripper 303 removes the m-bits from each (n+m)-bit codeword to generate n-bit codewords, because the m-bits are not needed by subsequent processes 304. The n-bit codewords are then provided to other processes 304.

The encoding system of FIG. 2 and the decoding system of FIG. 3 can, for example, be implemented in a hard disk drive system (e.g., in a hard disk drive controller) that stores data on a magnetic hard disk. Alternatively, the encoding system of FIG. 2 and the decoding system of FIG. 3 can be implemented in any other data storage system or in any data communication system. For example, the techniques of the present invention can be applied to cellular telephones, and other wireless or wired communication applications.

Figure 4:
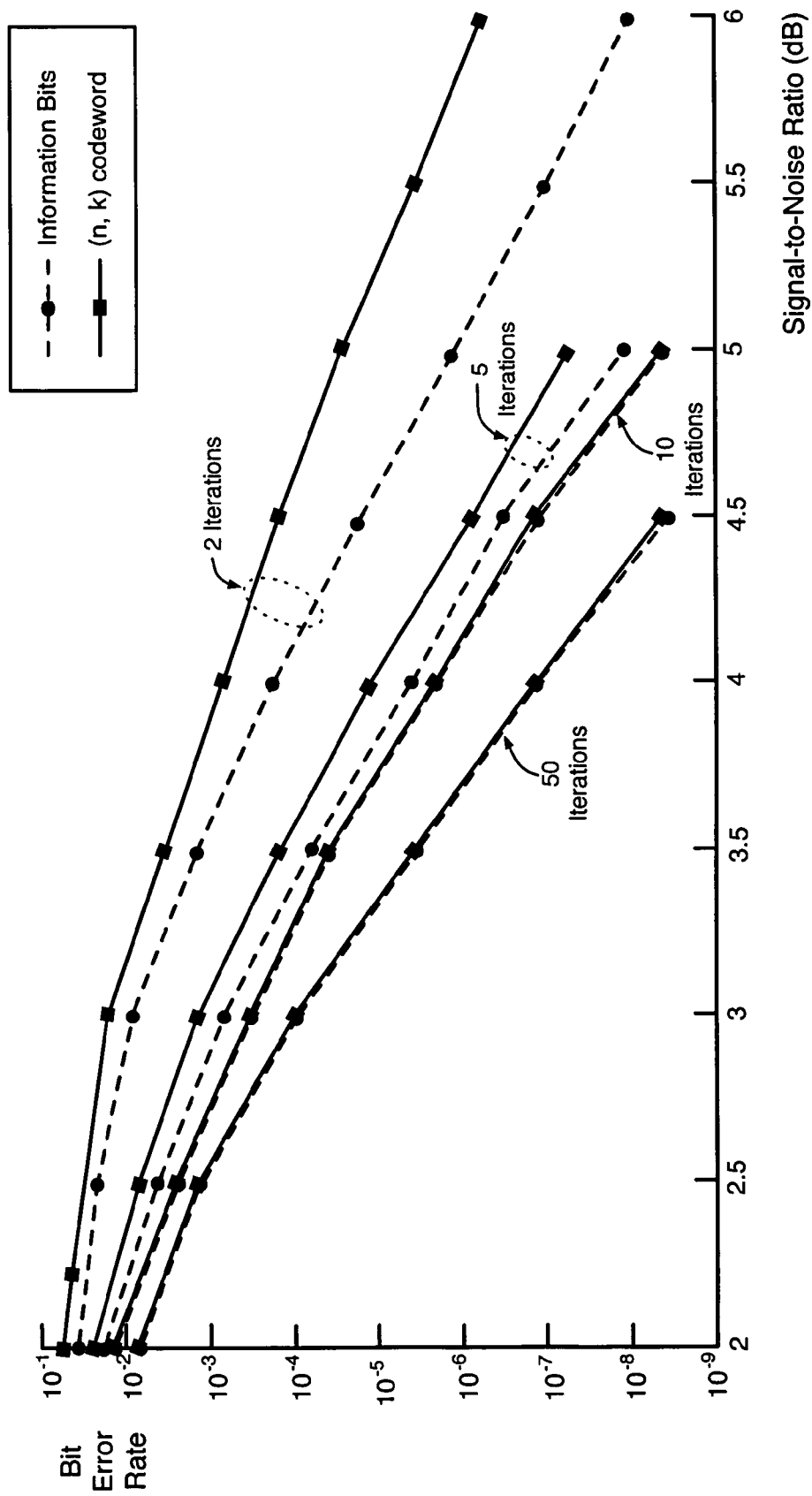
FIG. 4 is a graph that compares the bit error rates of information bits and codewords generated from an error correction system of the present invention.

FIG. 4 is a graph that compares information bits to (n, k) codewords generated from an error correction system of the present invention that adds one or more extra m-bits to each codeword, as described above. The graph of FIG. 4 plots the bit error rate versus the signal-to-noise ratio at various decoding iterations of a soft-decision decoder of the present invention. The signal-to-noise ratio is measured as a ratio of the energy of each bit divided by the energy of the noise signal.

After 2 decoding iterations, the bit error rate of the (n, k) codewords varies significantly from the bit error rate of the information bits at most of the signal-to-noise ratios shown in FIG. 4. After 5 decoding iterations, the bit error rate of the (n, k) codewords and the bit error rate of the information bits have begun to converge. After 10 decoding iterations, the bit error rate of the (n, k) codewords is substantially the same as the bit error rate of the information bits. The bit error rates of the (n, k) codewords and the information bits remain substantially the same after 50 decoding iterations.

Thus, the present invention provides systems and methods for improving the error rates of bits in codewords that correspond to low weights. The techniques of the present invention can, for example, improve the error rates of parity check bits generated from irregular RA LDPC codes. According to some embodiments, these techniques can approach equal error protection for both information and parity bits. The techniques of the present invention are crucial for certain applications where both information and parity bits are of interest in the system. The techniques of the present invention can be conveniently implemented in hardware or software.

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. It is intended that the scope of the invention be limited not with this detailed description, but rather by the claims appended hereto.

What is claimed is:

1. An apparatus comprising:
a first encoder that encodes an input sequence using an error correction code to generate codewords, wherein the first encoder provides a greater reliability to first bits in each of the codewords than to at least one second bit in each of the codewords;
a second encoder that maps the first bits in each of the codewords to generate mapped bits, wherein the second encoder does not use the second bit;
a first decoder that maps each of the mapped bits to regenerate the first bits;
a second decoder that receives the first bits from the first decoder and that receives the second bit, wherein the second decoder corrects errors in the first bits using soft-decision decoding to regenerate the codewords; and
a stripper block that removes the second bit from each of the codewords.

2. The apparatus defined in claim 1 wherein the second bit in each of the codewords corresponds to a column of a check matrix for the error correction code that has a lower weight than columns of the check matrix that correspond to the first bits in each of the codewords, the weight corresponding to a number of elements having non-zero values among elements in a column of the check matrix.

3. The apparatus defined in claim 1 wherein the first encoder causes a log likelihood ratio for the second bit to converge to a smaller magnitude than log likelihood ratios of each of the first bits.

4. The apparatus defined in claim 1 wherein the first encoder encodes the input sequence using an irregular repeat-accumulate low density parity check code.

5. The apparatus defined in claim 1 wherein the first bits comprise parity check bits.

6. The apparatus defined in claim 1 wherein the apparatus is a hard disk drive.

7. The apparatus defined in claim 1 wherein the first encoder provides a greater reliability to the first bits in each of the codewords than to at least two second bits in each of the codewords, the second encoder does not use the second bits, the second decoder receives the second bits, and the stripper block removes the second bits from each of the codewords.

8. The apparatus defined in claim 7 wherein the first encoder provides a greater reliability to the first bits in each of the codewords than to at least three of the second bits in each of the codewords.

9. The apparatus defined in claim 1 further comprising:
a multiplexer that combines the mapped bits with the second bit to generate words after the second encoder.

10. An apparatus comprising:
a first encoder that encodes an input sequence using an irregular error correction code to generate codewords, wherein each of the codewords comprises first bits and a second bit, and the first encoder causes a log likelihood ratio for the second bit to converge to a smaller magnitude than log likelihood ratios of each of the first bits;
a second encoder that maps the first bits in each of the codewords to generate mapped bits, wherein the second encoder does not process the second bit;
a first decoder that maps each of the mapped bits to regenerate the first bits;
a second decoder that receives the first bits from the first decoder and that receives the second bit, wherein the second decoder corrects errors in the first bits using soft-decision decoding that flips unreliable bits based on the log likelihood ratios of the first bits to regenerate the codewords; and a stripper block that removes the second bit from each of the codewords.

11. The apparatus defined in claim 10 wherein the first bits correspond to columns of a parity check matrix that each have a weight greater than a weight of a column of the parity check matrix that corresponds to the second bit, the weight corresponding to a number of elements having non-zero values among elements in a column of the parity check matrix.

12. The apparatus defined in claim 10 wherein the first encoder causes log likelihood ratios of at least two second bits in each of the codewords to converge to smaller magnitudes than the log likelihood ratios of the first bits, the second encoder does not process the second bits, the second decoder receives the second bits, and the stripper block removes the second bits from each of the codewords.

13. The apparatus defined in claim 12 wherein the first encoder causes log likelihood ratios of at least three of the second bits in each of the codewords to converge to smaller magnitudes than the log likelihood ratios of the first bits.

14. The apparatus defined in claim 10 wherein the first encoder encodes the input sequence using an irregular repeat-accumulate low density parity check code.

15. The apparatus defined in claim 10 wherein the first bits comprise parity check bits.

16. The apparatus defined in claim 10 wherein the apparatus is a hard disk drive.

17. A data storage system comprising code stored on a computer readable medium, the data storage system comprising:

first code for encoding an input sequence using an error correction code to generate codewords, wherein the first code for encoding applies a greater weight to first bits in each of the codewords than to at least one second bit in each of the codewords, the weight corresponding to a number of elements having non-zero values among a subset of elements in a parity check matrix;

second code for encoding the first bits in each of the codewords to generate mapped bits, wherein the second code for encoding does not use the second bit;

first code for decoding that maps each of the mapped bits to regenerate the first bits;

second code for decoding that receives the first bits from the first code for decoding and that receives the second bit, wherein the second code for decoding corrects errors in the first bits using soft-decision decoding to regenerate the codewords; and code for stripping that removes the second bit from each of the codewords.

18. The data storage system defined in claim 17 wherein the first code for encoding applies a greater weight to the first bits in each of the codewords than to at least two second bits in each of the codewords, the second code for encoding does not use the second bits, the second code for decoding receives the second bits, and the code for stripping removes the second bits from each of the codewords.

19. The data storage system defined in claim 18 wherein the first code for encoding applies a greater weight to the first bits in each of the codewords than to at least three of the second bits in each of the codewords.

20. The data storage system defined in claim 17 wherein the data storage system is a hard disk drive device.

* * * * *